(12) United States Patent
Hsu

(10) Patent No.: US 11,164,800 B2
(45) Date of Patent: Nov. 2, 2021

(54) TEST STRUCTURE, SEMICONDUCTOR DEVICE AND METHOD FOR OBTAINING FABRICATING INFORMATION IN SEMICONDUCTOR DEVICE

(71) Applicant: NANYA TECHNOLOGY CORPORATION, New Taipei (TW)

(72) Inventor: Shih-Hsing Hsu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/363,831

(22) Filed: Mar. 25, 2019

(65) Prior Publication Data

US 2020/0161195 A1 May 21, 2020

Related U.S. Application Data

(60) Provisional application No. 62/769,855, filed on Nov. 20, 2018.

(51) Int. Cl.
*H01L 21/66* (2006.01)
*H01L 21/8234* (2006.01)
*H01L 27/085* (2006.01)
*H01L 27/02* (2006.01)

(52) U.S. Cl.
CPC ...... *H01L 22/14* (2013.01); *H01L 21/823481* (2013.01); *H01L 22/32* (2013.01); *H01L 27/0207* (2013.01); *H01L 27/085* (2013.01)

(58) Field of Classification Search
None
See application file for complete search history.

(56) References Cited

U.S. PATENT DOCUMENTS

| 5,828,102 | A | * | 10/1998 | Bergemont | H01L 23/4824 |
| | | | | | 257/342 |
| 6,150,669 | A | * | 11/2000 | Nandakumar | H01L 22/34 |
| | | | | | 257/401 |
| 7,157,335 | B1 | * | 1/2007 | Cheng | H01L 27/115 |
| | | | | | 257/E21.679 |

(Continued)

FOREIGN PATENT DOCUMENTS

| CN | 101226934 A | 7/2008 |
| CN | 103094253 A | 5/2013 |

(Continued)

OTHER PUBLICATIONS

Office Action and search report issued in corresponding TW application No. 108126667 dated Sep. 7, 2020.

(Continued)

*Primary Examiner* — Nilufa Rahim
(74) *Attorney, Agent, or Firm* — Muncy, Geissler, Olds & Lowe, P.C.

(57) ABSTRACT

The present disclosure provides a test structure on a wafer. The test structure includes a plurality of isolation regions, an active region, a plurality of gate electrodes, a first metal element and a second metal element. The active region is disposed between the isolation regions. The gate electrodes are respectively disposed over one of the isolation regions and the active region. The first metal element is electrically coupled to one of the gate electrodes, and the second metal element is electrically coupled to the active region.

15 Claims, 20 Drawing Sheets

(56) References Cited

U.S. PATENT DOCUMENTS

| | | | |
|---|---|---|---|
| 8,187,974 B2 | 5/2012 | Park et al. | |
| 9,786,571 B1 | 10/2017 | Zhang | |
| 2010/0117140 A1* | 5/2010 | Choi | H01L 29/7923 257/324 |
| 2011/0221421 A1* | 9/2011 | Williams | H01L 24/49 324/76.11 |
| 2015/0048456 A1* | 2/2015 | Chuang | H01L 27/0207 257/368 |
| 2019/0326311 A1* | 10/2019 | Chakihara | H01L 22/12 |

FOREIGN PATENT DOCUMENTS

| | | |
|---|---|---|
| CN | 206312895 U | 7/2017 |
| CN | 107579014 A | 1/2018 |
| TW | 200541004 A | 12/2005 |
| TW | 200541004 A | 12/2005 |
| TW | 200743167 A | 11/2007 |
| TW | 200743167 A | 11/2007 |
| TW | 201248822 A | 12/2012 |
| TW | 201248822 A | 12/2012 |
| TW | 201320212 A | 5/2013 |
| TW | 201320212 A | 5/2013 |

OTHER PUBLICATIONS

Office Action dated May 8, 2020 related to Taiwanese Application No. 108126667.
Office Action dated Apr. 8, 2021 in CN Application No. 201910988282.3, 7 pages.

* cited by examiner

TEST STRUCTURE, SEMICONDUCTOR DEVICE AND METHOD FOR OBTAINING FABRICATING INFORMATION IN SEMICONDUCTOR DEVICE

PRIORITY CLAIM AND CROSS-REFERENCE

This application claims the priority benefit of U.S. provisional application Ser. No. 62/769,855, filed on Nov. 20, 2018. The entirety of the above-mentioned patent application is hereby incorporated by reference herein and made a part of this specification.

TECHNICAL FIELD

The present disclosure relates to a test structure, a semiconductor device and a method for obtaining fabricating information in a semiconductor device, and more particularly, to a test key, a semiconductor device having a test key and a method for obtaining various physical characteristics and performance associated with a particular fabricating process node during a wafer acceptance test (WAT).

DISCUSSION OF THE BACKGROUND

Semiconductor devices are used in a variety of electronic applications and fabricated by sequentially depositing insulating or dielectric layers, conductive layers, and semiconductor layers of material over a substrate, and patterning the various material layers using lithography to form circuit components and elements thereon.

Wafer-level testing plays an essential role in semiconductor device fabrication and serves to confirm the success of the fabrication process and to enhance the yield of the process. During the testing, defective dies are identified and discarded before they undergo post-processing operations, thereby reducing costly processing of defective dies.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a test structure on a wafer. The test structure includes a plurality of isolation regions, an active region, a plurality of gate electrodes, a first metal element and a second metal element. The active region is disposed between the plurality of isolation regions. The gate electrodes are respectively disposed over one of the isolation regions and the active region. The first metal element is electrically coupled to one of the gate electrodes.

The second metal element is electrically coupled to the active region.

In some embodiments, the test structure further includes a plurality of gate spacers disposed on sidewalls of the gate electrodes.

In some embodiments, the test structure further includes a doping region disposed in the active region.

In some embodiments, the first metal element is disposed on extending portions of the gate electrodes.

In some embodiments, the test structure further includes a plurality of gate dielectrics respectively disposed between each one of the gate electrodes and the wafer.

Another aspect of the present disclosure provides a semiconductor device. The semiconductor device includes a wafer and a test structure. The wafer has a plurality of component areas and at least one scribe line separating the component areas. The test structure is disposed in the scribe line. The test structure includes a plurality of isolation regions, a plurality of gate electrodes, and a plurality of gate dielectrics. The isolation regions are disposed in the wafer to define an active region in a serpentine-shaped configuration. The gate electrodes are disposed at boundaries where the active region is adjacent to the isolation regions. The gate dielectrics are disposed between the gate electrodes and the wafer.

In some embodiments, the test structure further includes a plurality of gate spacers disposed on sidewalls of the gate electrodes.

In some embodiments, the semiconductor device further includes a doping region disposed in the active region.

In some embodiments, the semiconductor device further includes at least one semiconductor component disposed in one of the plurality of component areas, and the test structure has at least one physical characteristic related to a structure of the semiconductor component.

In some embodiments, the test structure further includes a plurality of first metal elements and a plurality of second metal elements; the first metal elements are electrically coupled to the gate electrodes, and the second metal elements are electrically coupled to the active regions.

In some embodiments, the second metal elements are disposed at both ends of the active region where the gate electrodes are not disposed.

In some embodiments, the first metal elements are disposed on extending portions of the gate electrodes.

In some embodiments, the extending portions are disposed at both ends of the test structure as viewed from above.

Another aspect of the present disclosure provides a method for obtaining fabricating information in a semiconductor device. The method includes steps of forming a plurality of isolation regions in a scribe line of a wafer to define an active region in a serpentine-shaped configuration; forming a plurality of gate electrodes and a plurality of gate dielectrics on the wafer, wherein each of the plurality of gate electrodes overlaps a portion of the active region, and the gate dielectrics are disposed between the gate electrodes and the wafer; measuring a first resistance of the gate electrodes; and determining whether the gate electrodes have a bridge defect, based on the first resistance.

In some embodiments, the method further includes steps of forming a plurality of gate spacers on sidewalls of the gate electrodes; and forming a doping region in the active region.

In some embodiments, the method further includes steps of measuring a second resistance of the active region; measuring a capacitance between one of the gate electrodes and the active region; and determining whether the active region has a rounded-corner defect, based on the second resistance and the capacitance.

In some embodiments, the method further includes a step of determining an amount of implant buried in the active region, based on the second resistance, when the active region has a right-angled corner.

In some embodiments, the method further includes steps of forming a plurality of first metal elements electrically coupled to one of the gate electrodes; and forming a plurality of second metal elements electrically coupled to the active region, wherein the first resistance is measured through the first metal elements, the second resistance is measured through the second metal element, and the capacitance is measured through one of the first metal elements and one of the second metal elements.

With the above-mentioned configurations of the semiconductor device, the bridge defect, the rounded-corner defect, and an amount of implant buried in the active region can be checked during a wafer acceptance test to determine the quality of the semiconductor components on the wafer before final assembly and packaging.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
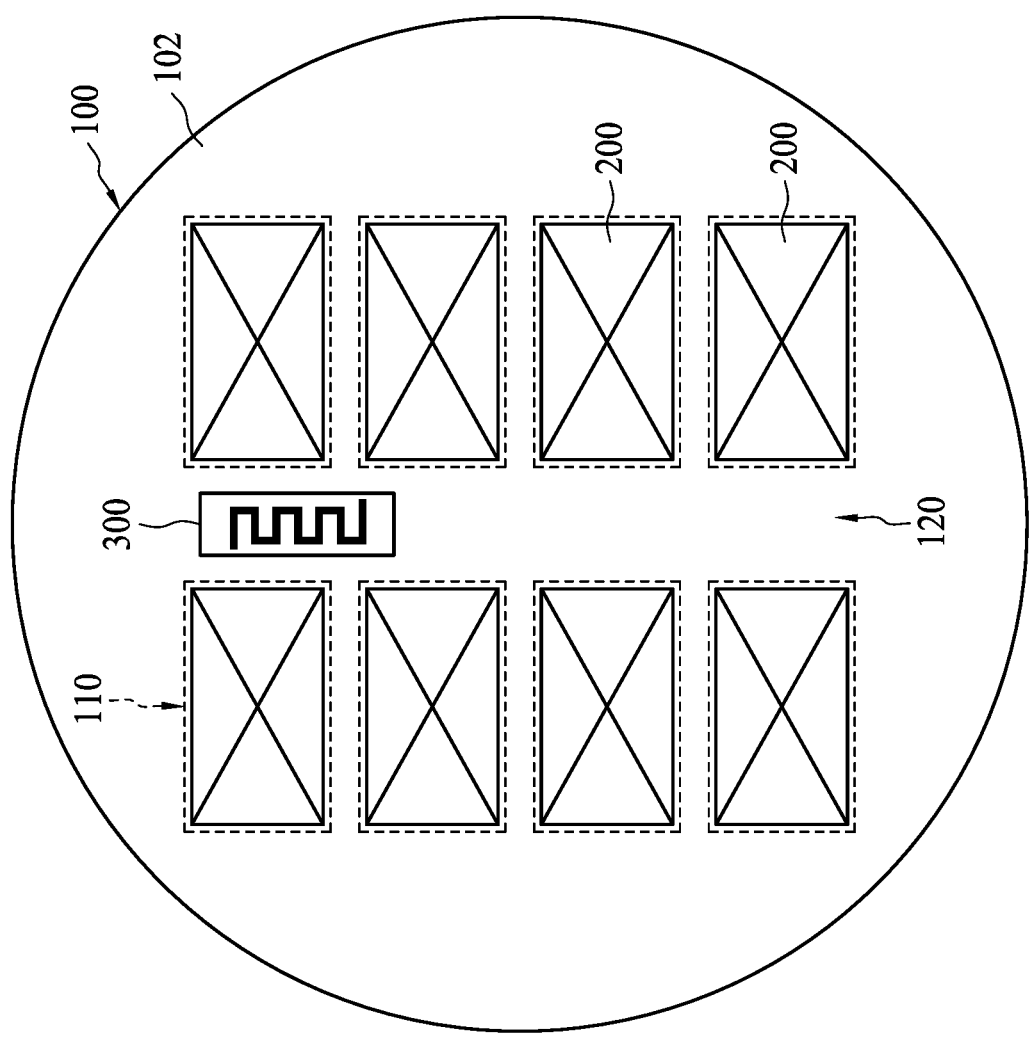
FIG. 1 is a top view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a top view of a semiconductor device 10 in accordance with some embodiments of the present disclosure. The semiconductor device 10 includes a semiconductor wafer 100, a plurality of semiconductor components 200, and a test structure 300. In some embodiments, the semiconductor components 200 and the test structure 300 are disposed on a front surface 102 of the semiconductor wafer 100. In some embodiments, the semiconductor components 200 are metal-oxide-semiconductor (MOS) transistors. In some embodiments, the semiconductor components 200 are disposed in a plurality of component areas 110 defined on the semiconductor wafer 100. In some embodiments, the component areas 110 are separated by one or more scribe lines 120. In some embodiments, the scribe lines 120 are formed in order to dice the semiconductor wafer 100 during final assembly and package phases. In some embodiments, the test structure 300 is disposed on one of the scribe lines 120, which permits the test structure 300 to be placed in the semiconductor wafer 100 without taking up space intended for the semiconductor components 200. In some embodiments, the scribe lines 120 are used to provide a space for a saw, laser or other cutting system to singulate or cut the semiconductor wafer 100 into individual semiconductor components 200 without cutting or damaging the semiconductor components 200. In some embodiments, when a dicing operation is performed, the wafer area of the scribe lines 120 is wasted and the test structure 300 is destroyed.

In some embodiments, the test structure 300 is fabricated for obtaining various physical characteristics and performance associated with at least one particular fabricating process node. In some embodiments, the test structure 300 is formed as part of the process for fabricating the structures of the semiconductor component 200. In some embodiments, the test structure 300 is selected to replicate specific features of structures in the semiconductor component 200, such as a gate structure and an active region (or the isolation region). In some embodiments, the test structure 300 is formed using the same processes as those used to form the semiconductor components 200, permitting testing and verification of the processes without contaminating or interfering with the production of the semiconductor components 200. In some embodiments, using the same process for forming the test structure 300 and the semiconductor component 200 results in the test structure 300 having physical characteristics similar to those of the semiconductor component 200; therefore, the test structure 300 can be used to test the characteristics of the semiconductor component 200 during processing. In some embodiments, placing the test structure 300 on the production wafer instead of using sacrificial wafers for testing reduces wafer-to-wafer variation that may not be observed with dedicated test wafers.

Figure 2:
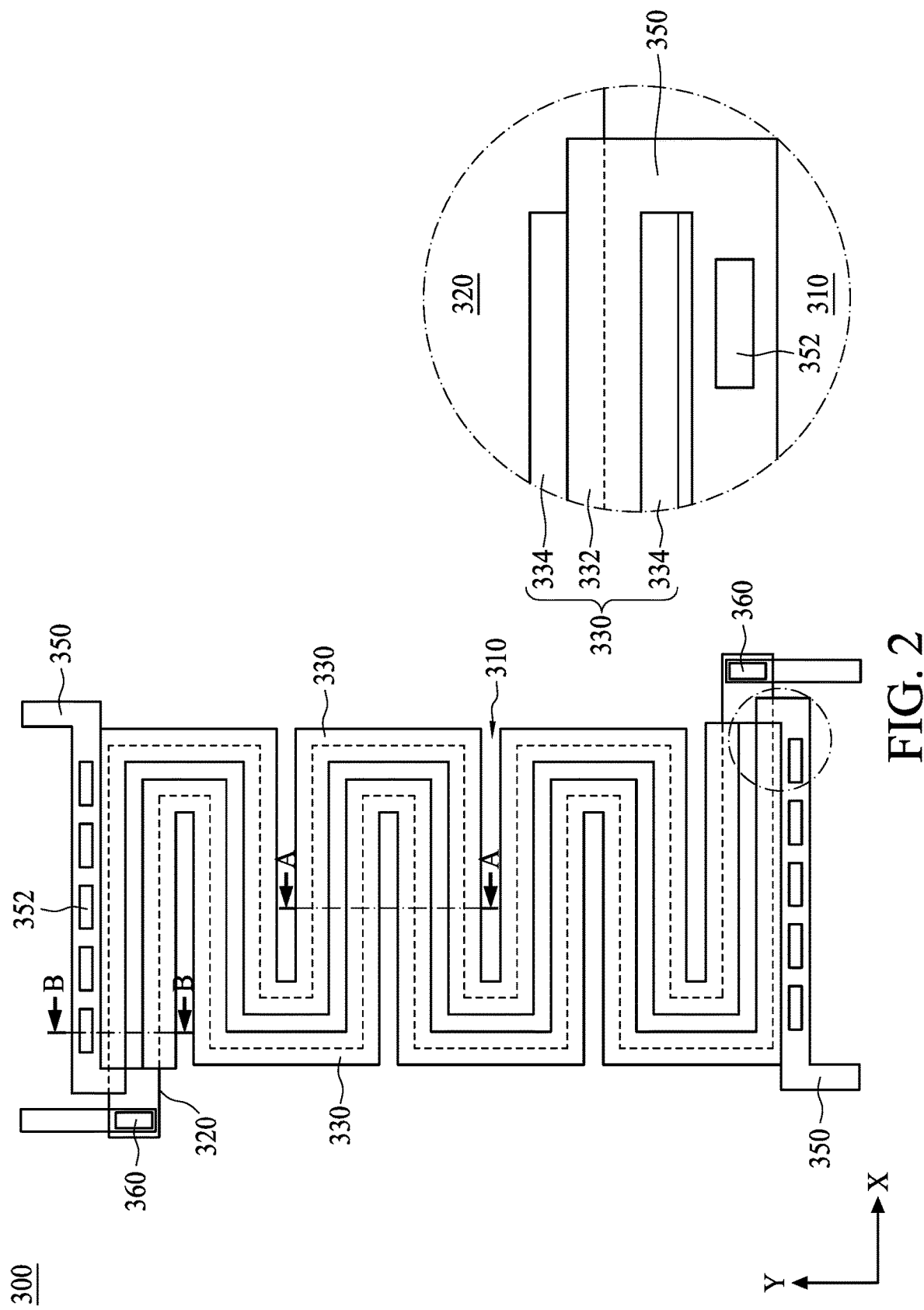
FIG. 2 is a top view of a test structure in accordance with some embodiments of the present disclosure.
Figure 3A:
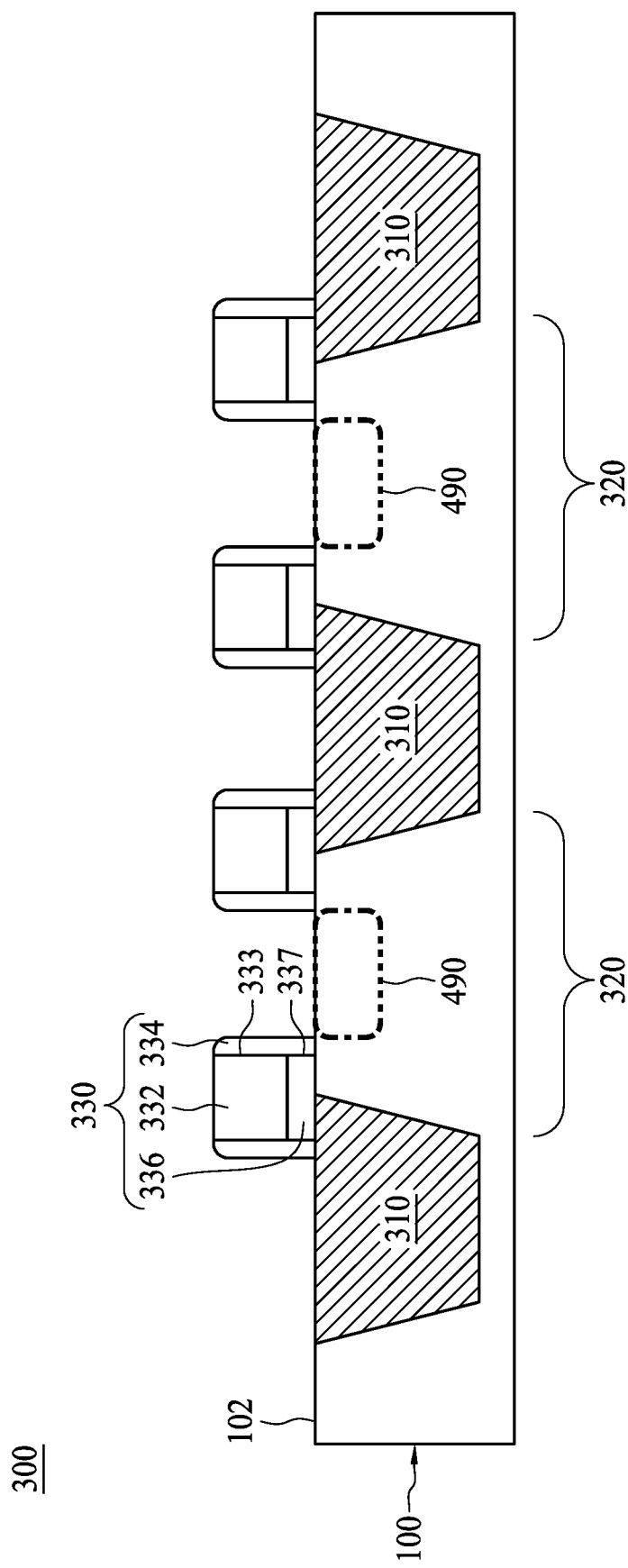
FIG. 3A is a cross-sectional view taken along the line A-A illustrated in FIG. 2.

FIG. 2 is a top view of a test structure 300 in accordance with some embodiments of the present disclosure. FIG. 3A is a cross-sectional view taken along the line A-A illustrated in FIG. 2. Referring to FIGS. 2 and 3A, in some embodiments, the test structure 300 includes a plurality of isolation regions 310 formed in the semiconductor wafer 100 to define and electrically isolate an active region 320 in a serpentine-shaped configuration, when viewed in the plan view. In some embodiments, the test structure 300 further includes a plurality of gate structures 330 disposed on boundaries where the active region 320 is adjacent to the isolation regions 310. In some embodiments, the gate structures 330 are in a serpentine-shaped configuration. In some embodiments, the total length of the active region 320, and the number of turns throughout the length of the active region 320, are selected to effectively indicate weak points in the semiconductor component 200. In some embodiments, a length of the active region 320 is greater than those of the gate structures 330, so that at least one metal element (as will be described later) can be disposed on the active region 320.

In some embodiments, the gate structure 330 includes a gate electrode 332 and a gate spacer 334 disposed on sidewalls 333 of the gate electrode 332. In some embodiments, the gate electrode 332 includes polycrystalline silicon (polysilicon), metal, silicide, or a combination thereof. In some embodiments, the gate spacer 334 includes oxide, nitride, or oxynitride. In some embodiments, the gate structure 330 further includes a gate dielectric 336 disposed between the semiconductor wafer 100 and the gate electrode 332, and the gate spacer 334 is further disposed on sidewalls 337 of the gate dielectric 336. In some embodiments, the gate dielectric 336 includes oxide, nitride, oxynitride, or the like.

Figure 3B:
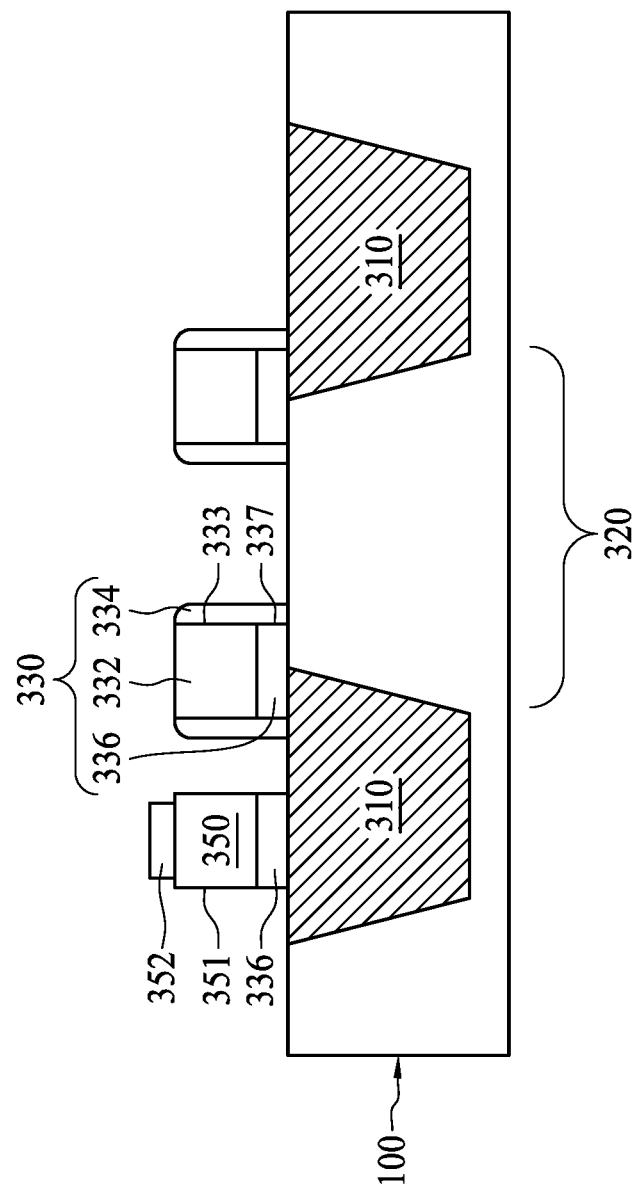
FIG. 3B is a cross-sectional view taken along the line B-B illustrated in FIG. 2.

In some embodiments, the test structure 300 further includes a plurality of first metal elements 352 electrically coupled to the gate electrodes 332, respectively, and a plurality of second metal elements 360 electrically coupled to the active region 320. In some embodiments, the first metal elements 352 are disposed on extending portions 350 of the gate electrodes 332. In some embodiments, the extending portions 350 are disposed at both ends of the test structure 300 as viewed from above, wherein the ends are defined in an x-y coordinate system as lower and upper positions along a y direction. Referring to FIG. 3B, in some embodiments, the extending portions 350 are disposed over the isolation regions 310. In some embodiments, the gate spacer 334 is not disposed on sidewalls 351 of the extending portions 350. In some embodiments, the gate dielectric 336 is further disposed between the extending portion 350 and the isolation region 310 of the semiconductor wafer 100. Referring again to FIG. 2, in some embodiments, the second metal elements 360 are disposed at both ends of the active region 320 where the gate electrodes 332 are not disposed. In some embodiments, the second metal elements 360 are formed using the same processes as those used to form the first metal elements 352.

In some embodiments, a test apparatus (not shown) can determine whether a bridge defect occurs by measuring a first resistance between the gate electrodes 332 and the first metal elements 352 and comparing the measured first resistance to a predetermined resistance measured from the gate electrodes 332 which are not connected to each other. In detail, the bridge defect occurs when the gate electrodes 332 are connected to each other, thus the first resistance measured from the gate electrodes 332 connected to each other is lower than the predetermined resistance. In some embodiments, the bridge effect occurs because the blanket gate electrode layer used for forming the gate electrodes 332 was not well etched.

In some embodiments, the test apparatus can determine whether a corner-rounded defect occurs by measuring a second resistance of the active region 320 from the second metal elements 360 and comparing the measured second resistance with a preset resistance measured from the active region 320 having a right-angled corner. Specifically, an area of the active region 320 having the corner-rounded defect is less than that of the active region 320 having the right-angled corner; thus the second resistance of the active region 320 having the corner-rounded defect is higher than the preset resistance since the resistance of the active region 320 is given by $R=\rho L/A$, wherein the $\rho$ is a resistivity of the material of the active region 320, L is the length of the active region 320, and A is the area of the active region 320.

In some embodiments, the resistance of the active region 320 may further be used for monitoring an amount of implant buried in the active region 320, since the resistance of the active region 320 is decreased when the amount of the implant buried therein increases.

In some embodiments, a capacitor is formed by the gate electrode 332 overlapping a portion of the active region 320; thus the test apparatus can measure a capacitance of the capacitor to determine the resistance variation of the active region 320 induced by the corner-rounded defect or by the amount of the implant buried in the active region 320. More particularly, the capacitance of the capacitor is reduced when an area of overlap between the gate electrode 332 and the active region 320 decreases, since the capacitance is given by $C=\varepsilon A/d$, wherein $\varepsilon$ is the permittivity of gate dielectric 336, A is the area of overlap between the gate electrode 332 and the active region 320, and d is the distance between the gate electrode 332 and the active region 320. Accordingly, the capacitance is only varied when the corner-rounded defect occurs since the area of overlap between the gate electrode 332 and the active region 320 is decreased. In other words, when the capacitance measured by the test apparatus is equal to a predetermined capacitance and the active region 320 has a right-angled corner, the variation of the second resistance is induced by the amount of the implant buried in the active region 320.

Figure 4:
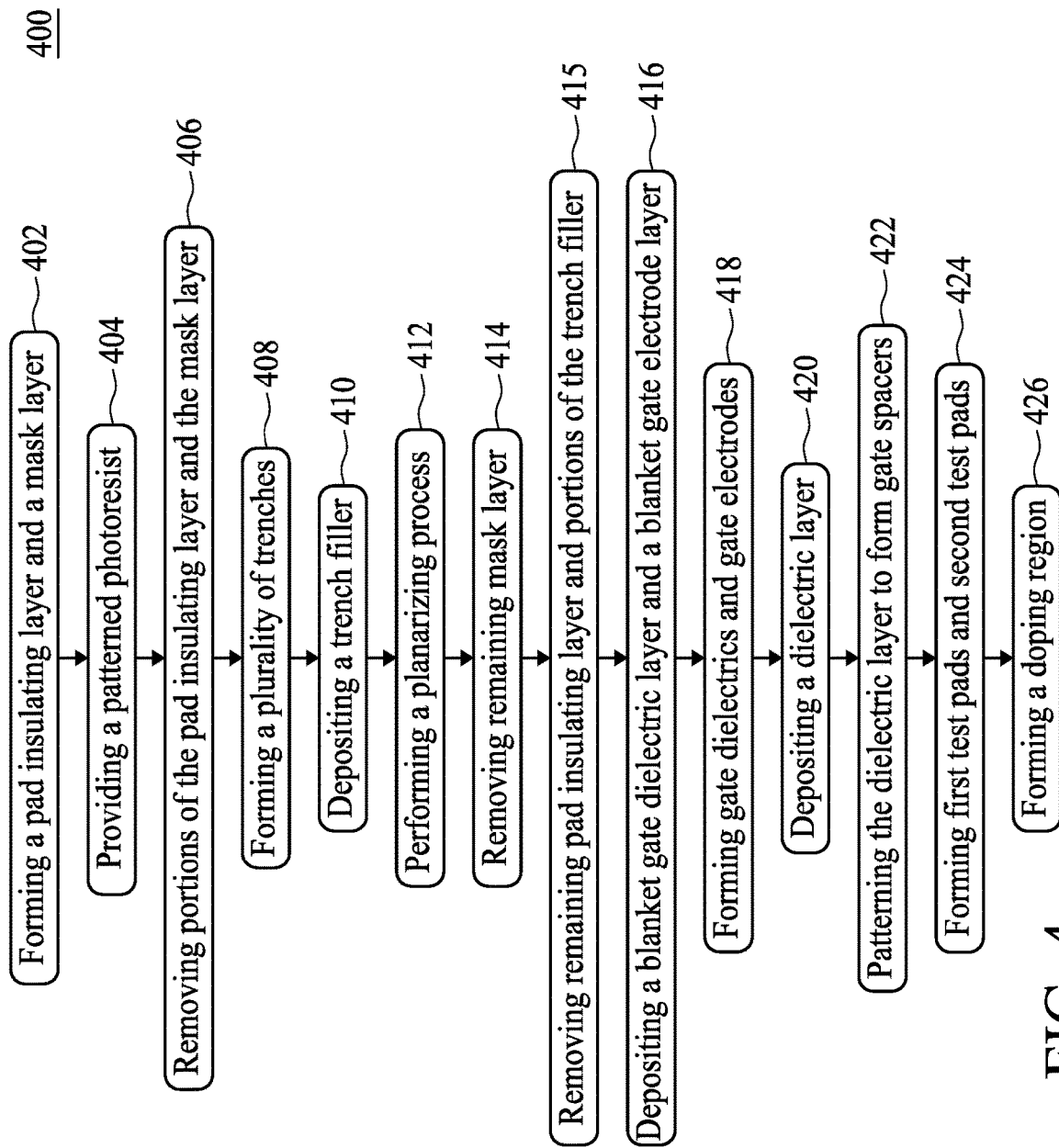
FIG. 4 is a flow diagram illustrating a method for manufacturing a test structure, in accordance with some embodiments of the present disclosure.

FIG. 4 is a flow diagram illustrating a method 400 for manufacturing a test structure 300, in accordance with some embodiments of the present disclosure. FIGS. 5 to 17 are schematic diagrams illustrating various fabrication stages constructed according to the method for manufacturing the test structure 300 in accordance with some embodiments of the present disclosure. The stages shown in FIGS. 5 to 17 are also illustrated schematically in the process flow in FIG. 4.

In the subsequent discussion, the fabrication stages shown in FIGS. 5 to 17 are discussed in reference to the process steps in FIG. 4.

Figure 5:
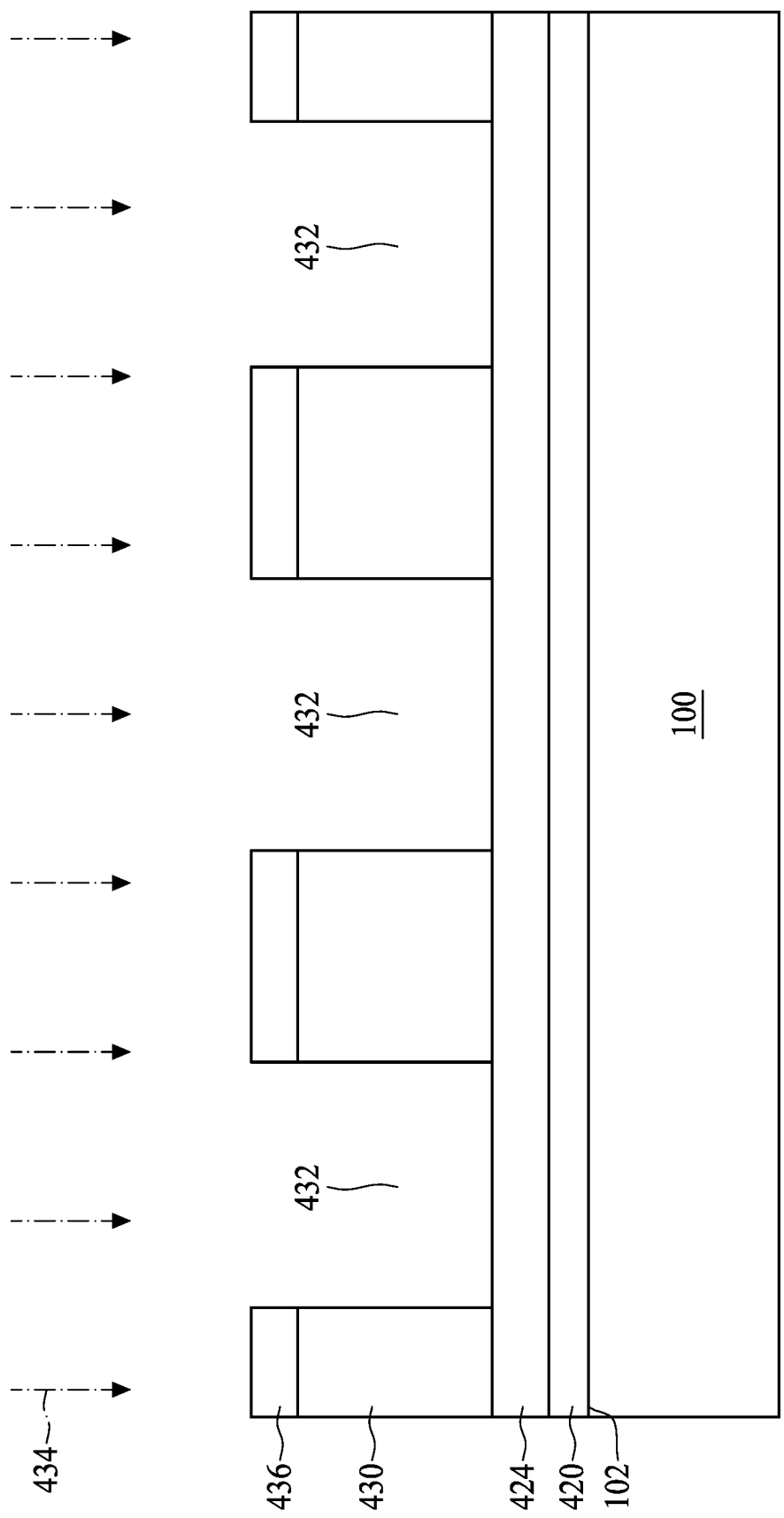
FIGS. 5 to 15 illustrate cross-sectional views of intermediate stages in the formation of a test structure in accordance with some embodiments of the present disclosure.

Referring to FIG. 5, in some embodiments, a pad insulating layer 420 and a mask layer 424 are formed sequentially on a semiconductor wafer 100 according to a step 402 in FIG. 4. In some embodiments, the pad insulation layer 420 is disposed between a front surface 102 of the semiconductor wafer 100 and the mask layer 424. In some embodiments, the pad insulating layer 420 functions as a buffer layer for mitigating stress between the semiconductor wafer 100 and the mask layer 424. In some embodiments, the pad insulating layer 420 includes oxide. In some embodiments, the pad insulating layer 420 is formed by using a chemical vapor deposition (CVD) process or a thermal oxidation process. In some embodiments, the mask layer 424 includes silicon nitride. In some embodiments, the mask layer 424 is formed by a low pressure CVD process.

Next, a patterned photoresist 430 is provided over the mask layer 424 according to a step 404 in FIG. 4. In some embodiments, the patterned photoresist 430 is provided by steps including (1) coating an unpatterned photoresist layer on the mask layer 424, and (2) performing a photolithography operation to define the patterned photoresist 430 required to form openings 432. In some embodiments, the openings 432 are formed in the unpatterned photoresist layer by exposing the unpatterned photoresist layer to actinic radiation 434 through a patterned photomask 436 and developing away either the exposed or unexposed regions of the unpatterned photoresist layer.

Figure 6:
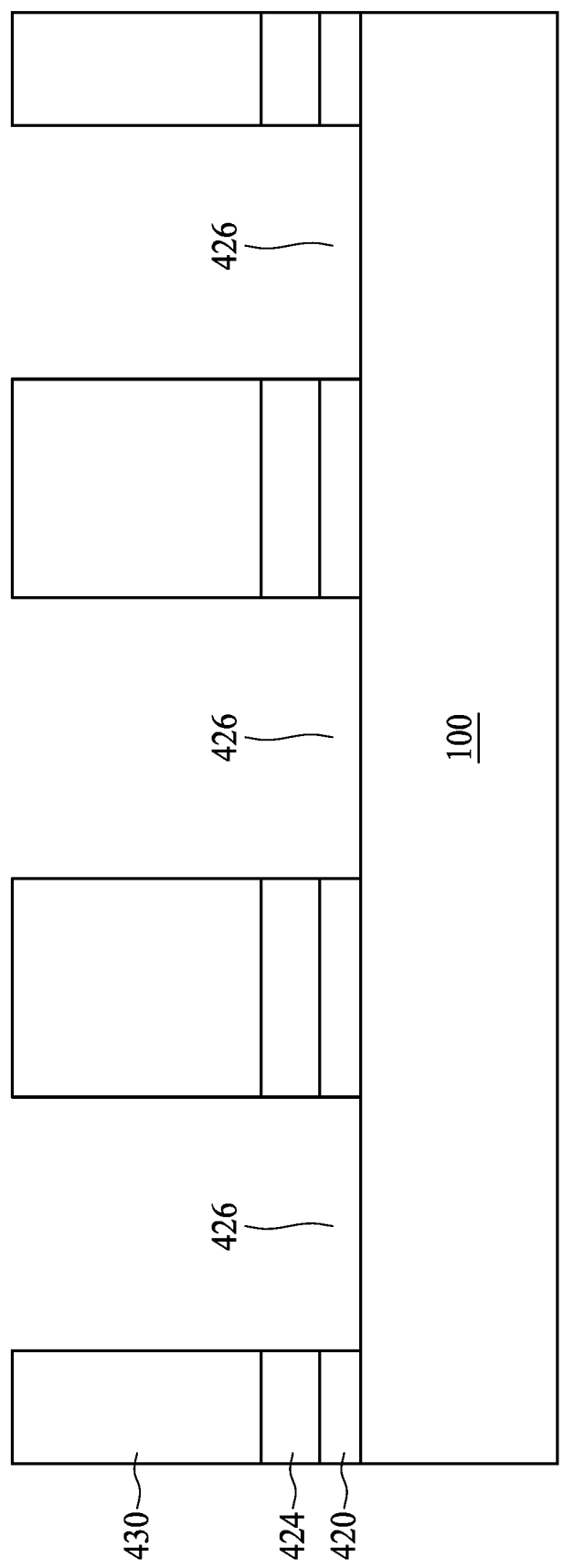

Referring to FIG. 6, in some embodiments, an etching process is performed to remove portions of the pad insulating layer 420 and the mask layer 424 according to a step 406 in FIG. 4. In some embodiments, unnecessary portions of the pad insulating layer 420 and the mask layer 424 are etched away using the patterned photoresist 430 as a mask. In some embodiments, the pad insulating layer 420 and the mask layer 424 are anisotropically dry-etched through the patterned photoresist 430 to form apertures 426. In some embodiments, the pad insulating layer 420 and the mask layer 424 are etched by, for example, a reactive ion etching (RIE) process, using the patterned photoresist 430 as a mask. In some embodiments, the patterned photoresist 430 is then removed by, for example, a wet etching process.

Figure 7:
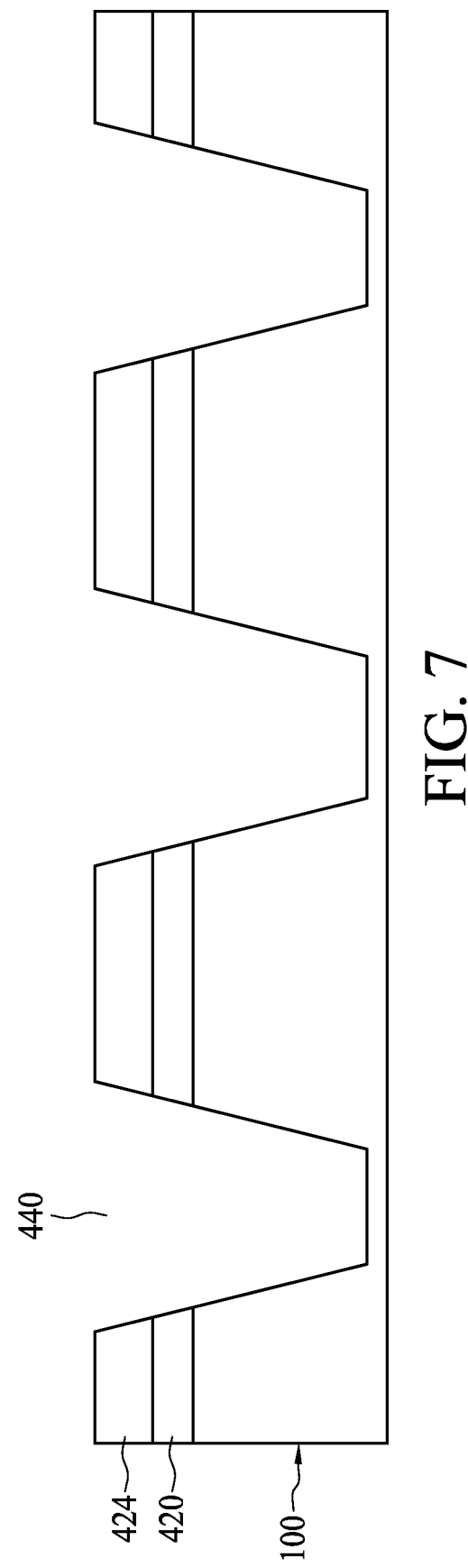

Referring to FIG. 7, in some embodiments, a plurality of trenches 440 are etched into the semiconductor wafer 100 according to a step 408 in FIG. 4. In some embodiments, the semiconductor wafer 100 is dry-etched through the apertures 426 (shown in FIG. 6) to form the trenches 440 in the semiconductor wafer 100. In some embodiments, the semiconductor wafer 100 is etched by, for example, an RIE process, using the pattern in the mask layer 424 (and the pad insulating layer 420) as a hardmask. In some embodiments, the corner-rounded defect occurs when the aperture 426 (or the remaining mask layer 424) for patterning the trenches 440 deviates from the designed pattern.

Figure 8:
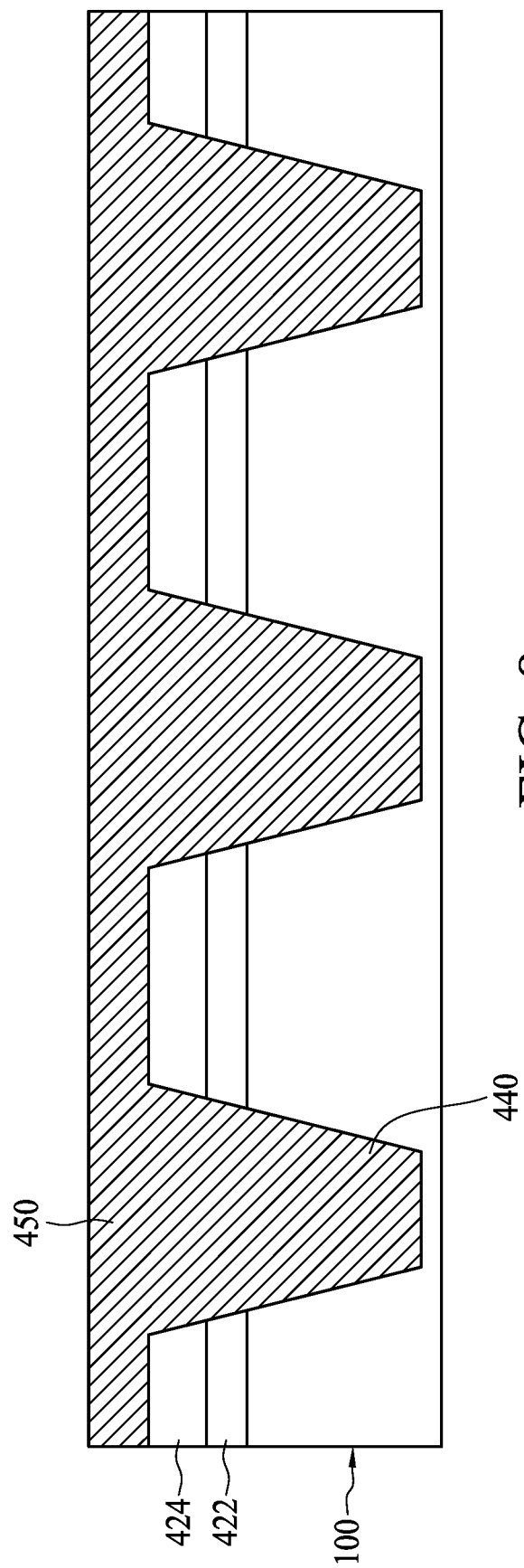

Referring to FIG. 8, in some embodiments, a trench filler 450 is deposited on the mask layer 424 and fills the trenches 440 according to a step 410 in FIG. 4. In some embodiments, the trench filler 450 includes silicon oxide, silicon nitride, silicon oxynitride, fluoride-doped silicate glass (FSG), a low-K dielectric material, and/or the combination thereof. In some embodiments, the trench filler 450 is deposited using, for example, a low-pressure CVD process or a high-density plasma process. In some embodiments, the trench filler 450 is used to provide an insulating fill for the shallow trench isolation.

Figure 9:
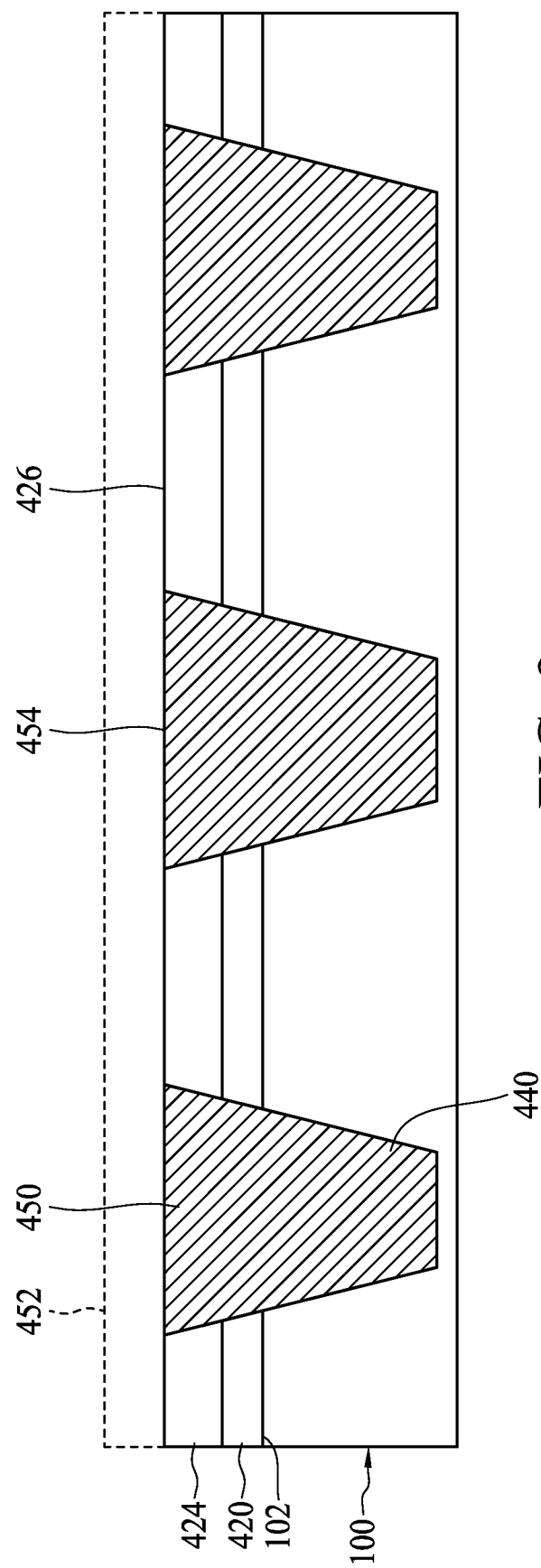

Referring to FIG. 9, in some embodiments, a planarizing process is performed to remove excess portions 452 of the trench filler 450 over an upper surface 426 of the mask layer 424 according to a step 412 in FIG. 4. In some embodiments, a chemical mechanical polishing (CMP) process is used to provide a planar topography such that a top surface 454 of the trench filler 450 is approximately coplanar with the upper surface 426. In some embodiments, the trench filler 450 undergoes CMP utilizing the mask layer 424 as a polish stop.

Figure 10:
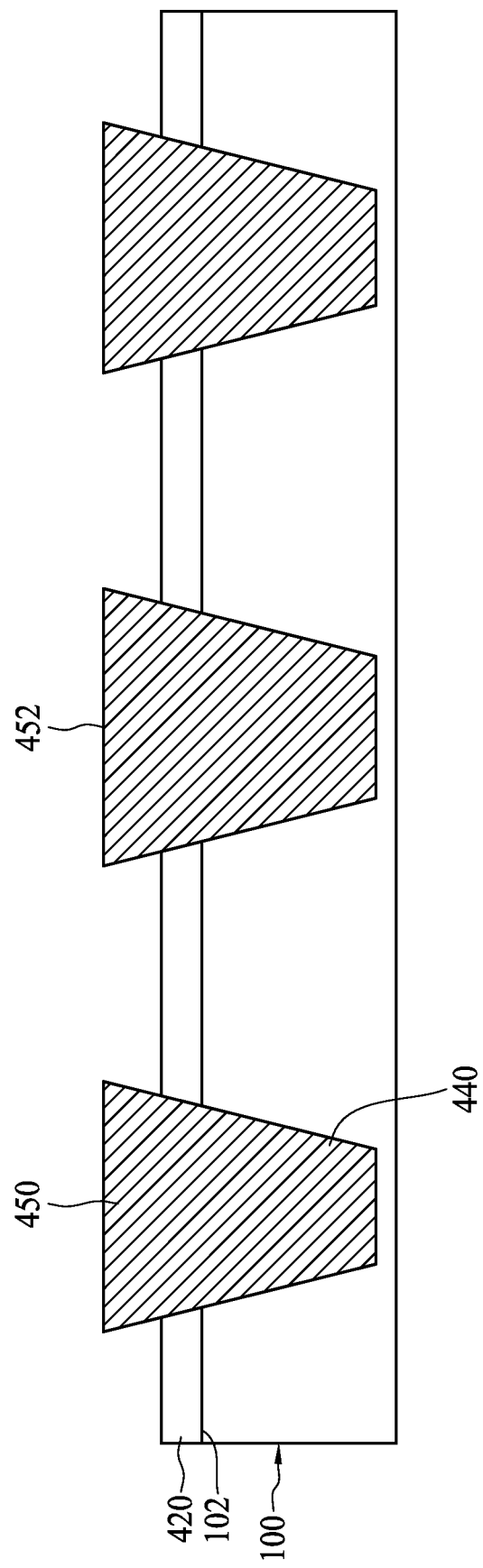

Referring to FIG. 10, in some embodiments, the remaining mask layer 424 is removed according to a step 414 in FIG. 4. In some embodiments, a typical hot phosphoric acid ($H_3PO_4$) wet etch is used to remove the remaining mask layer 424 without etching the pad insulating layer 420 or the trench filler 450.

Figure 11:
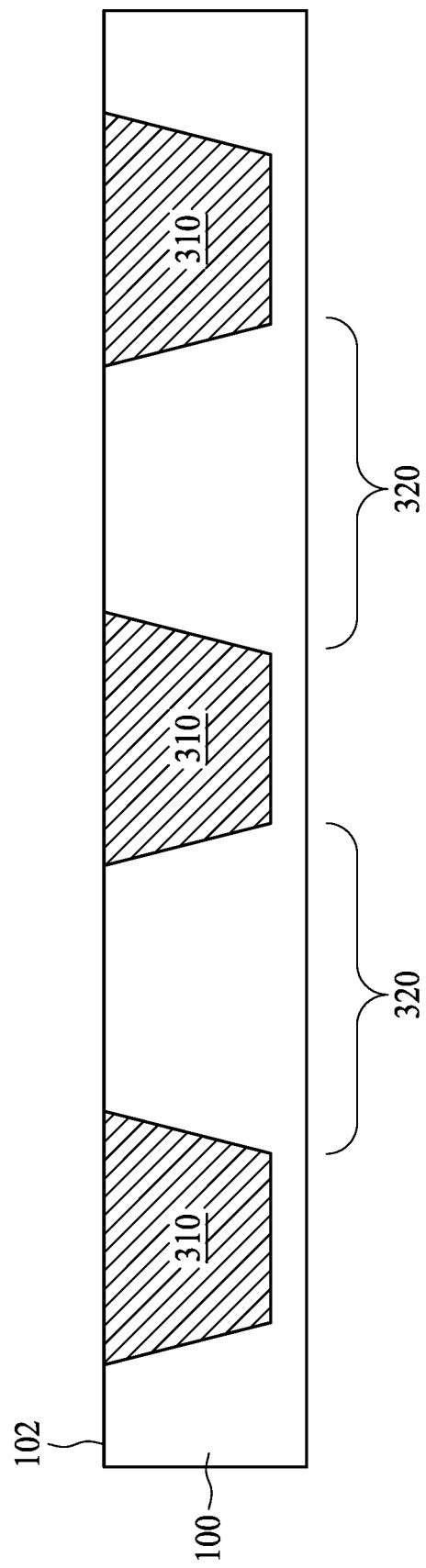

Referring to FIG. 11, in some embodiments, the trench filler 450 and the remaining pad insulating layer 420 are polished down to the front surface 102 of the semiconductor wafer 100 to complete the shallow trench isolation according to a step 415 in FIG. 4. In some embodiments, the trench filler 450 and the pad insulating layer 420 are polished by a CMP process. In some embodiments, after the removal process, the isolation regions 310 are formed to define and electrically isolate the active region 320 in the serpentine-shaped configuration. In some embodiments, the isolation regions 310 are shallow trench isolation regions.

Figure 12:
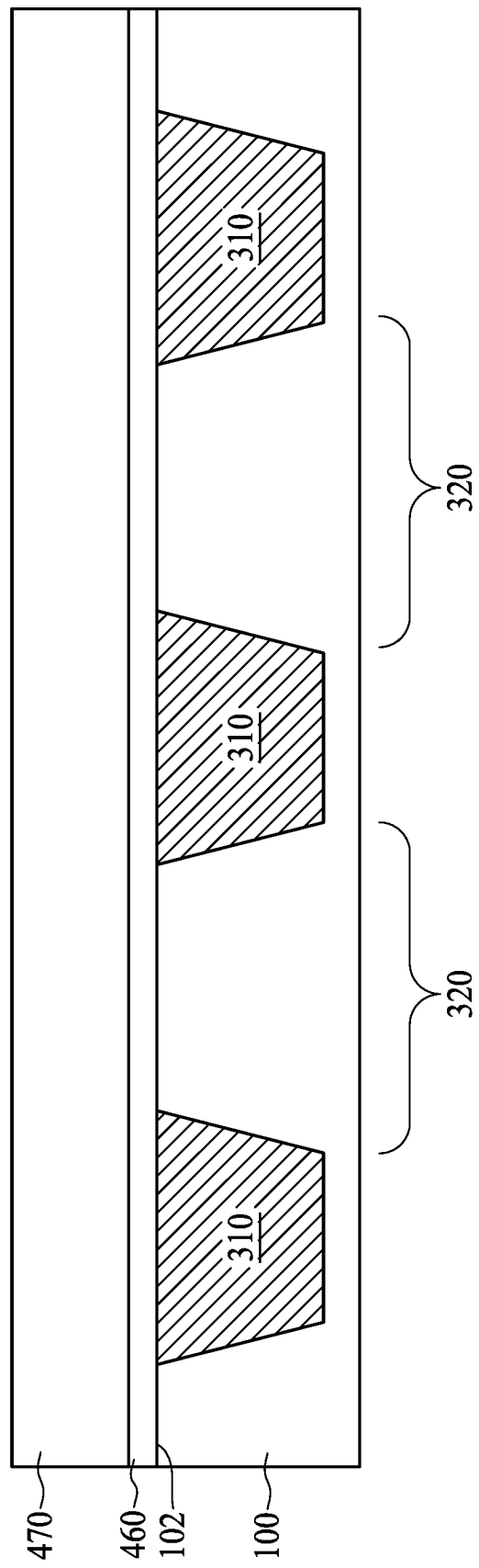

Referring to FIG. 12, a blanket gate dielectric layer 460 and a blanket gate electrode layer 470 are deposited over the semiconductor wafer 100 according to a step 416 in FIG. 4. In some embodiments, the blanket gate dielectric layer 460 is disposed between the semiconductor wafer 100 and the blanket gate electrode layer 470. In some embodiments, the blanket gate dielectric layer 460 includes oxide, nitride, oxynitride, but is not limited thereto. In some embodiments, the blanket gate dielectric layer 460 is formed by a CVD process, an atomic layer deposition (ALD) process, a thermal oxidation process, or the like. In some embodiments, the blanket gate electrode layer 470 includes polysilicon, metal, silicide, or a combination thereof. In some embodiments, the blanket gate electrode layer 470 is formed by a CVD process, a physical vapor deposition (PVD) process, an ALD process, or other suitable process.

Figure 13:
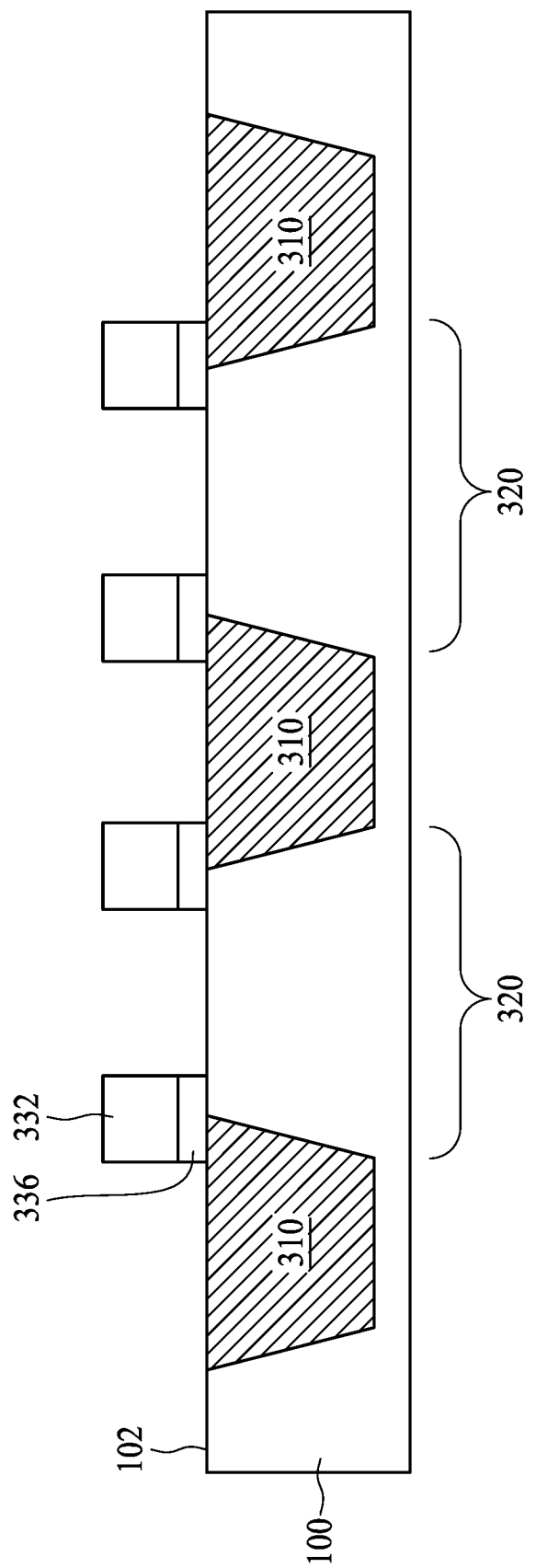

Referring to FIG. 13, gate electrodes 332 and gate dielectrics 336 are formed according to a step 418 in FIG. 4. In some embodiments, a patterning process and an etching process are performed to remove portions of the blanket gate dielectric layer 460 and the blanket gate electrode layer 470. Accordingly, the gate dielectric 336 and the gate electrode 332 are formed. In some embodiments, the gate electrodes 332 and the gate dielectrics 336 are disposed at the boundaries where the active region 320 is interfaced with the isolation regions 310. In some embodiments, the gate electrodes 332 overlap a portion of the active region 320. In some embodiments, the area of overlap between one of the gate electrodes 332 and the active area 320 controls the capacitor formed by such overlap. In some embodiments, unnecessary portions of the blanket gate electrode layer 470 are etched away to form the gate electrodes 332. In some embodiments, the bridge defect mentioned above occurs when the unnecessary portions of the blanket gate electrode layer 470 are not properly etched away.

Figure 14:
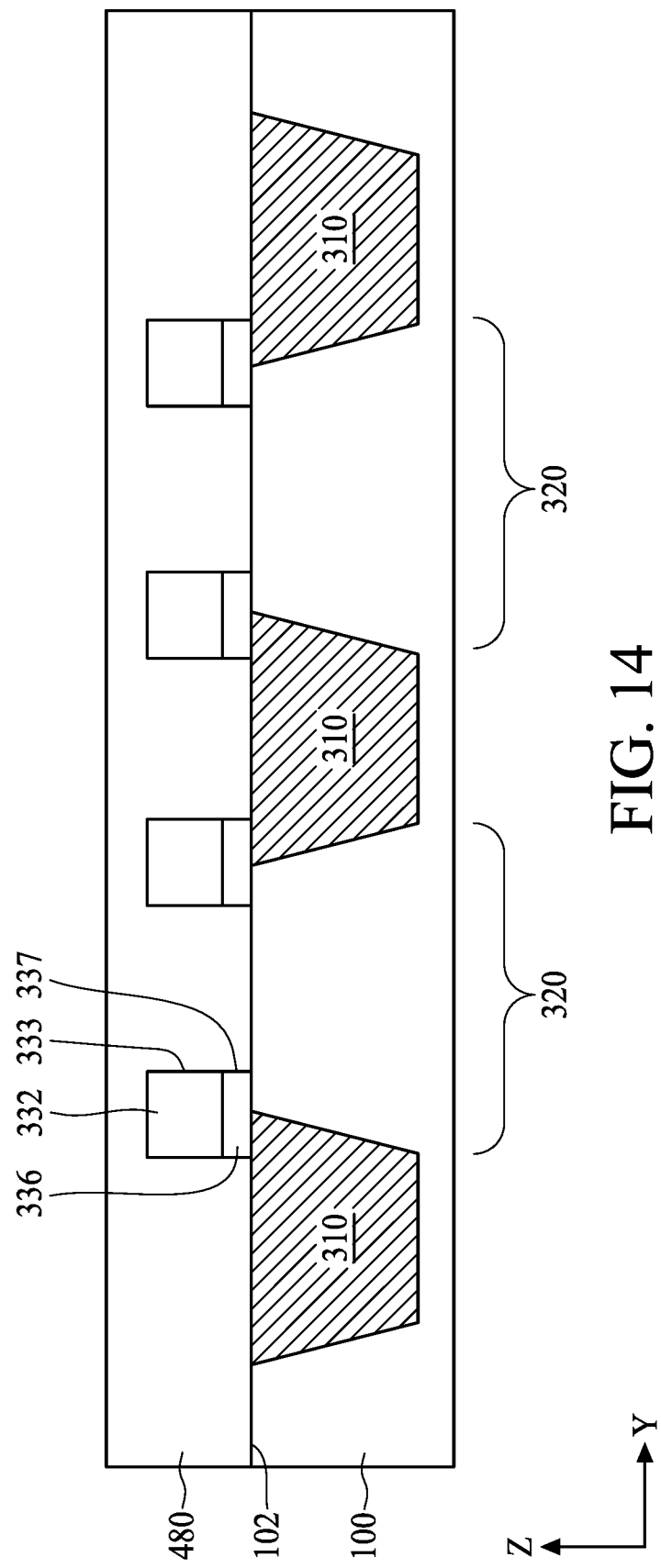

Referring to FIG. 14, a dielectric layer 480, using a CVD process, is deposited to cover the front surface 102, the gate dielectric 336 and the gate electrode 332 according to a step 420 in FIG. 4. In some embodiments, the dielectric layer 480 includes oxide, nitride, oxynitride, or the combination thereof, but is not limited thereto.

Figure 15:
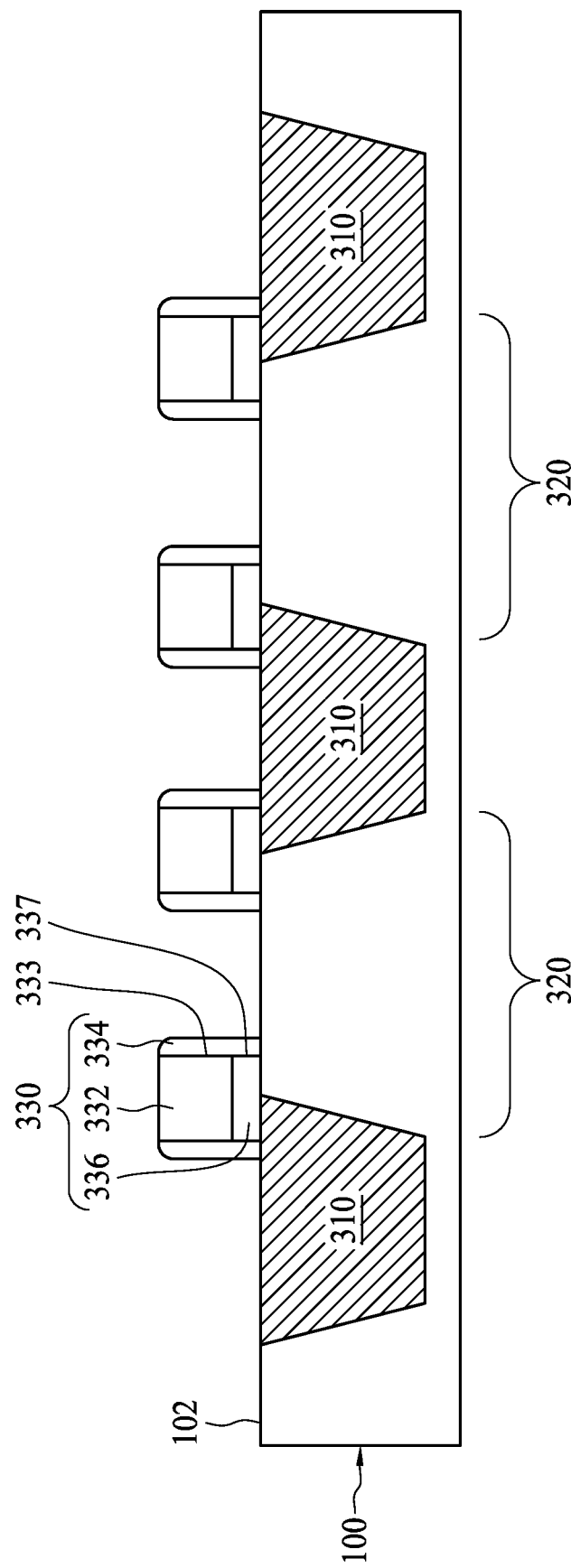

Referring to FIG. 15, the dielectric layer 480 is patterned to form gate spacers 334 according to a step 422 in FIG. 4. In some embodiments, the dielectric layer 480 is patterned using an anisotropic etching process to remove horizontal portions of the dielectric layer 480, while the vertical portions of the dielectric layer 480 on sidewalls 333 of the gate electrodes 332 and sidewalls 337 of the gate dielectrics 336 are left to form the gate spacers 334.

Figure 16:
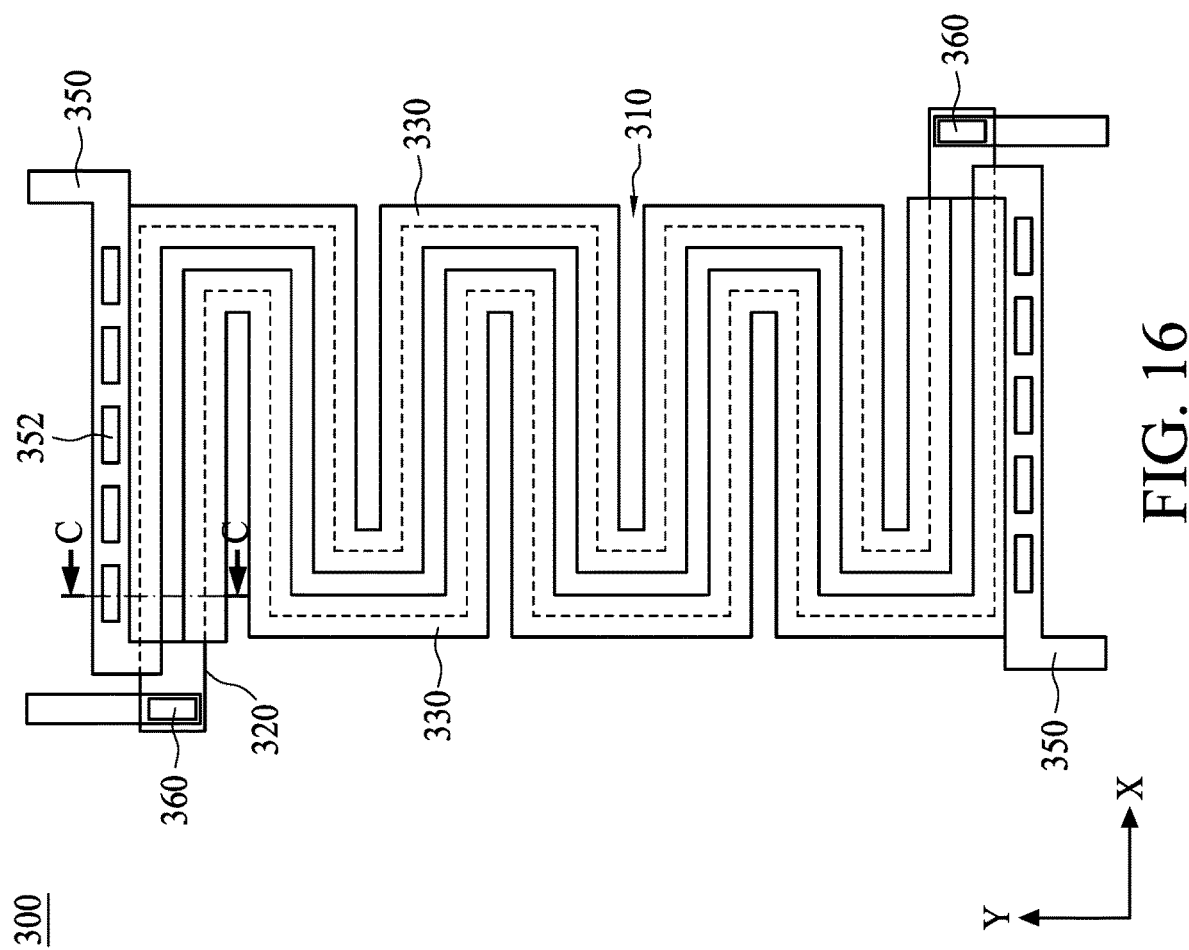
FIG. 16 is a top view of an intermediate stage in the formation of the test structure in accordance with some embodiments of the present disclosure.
Figure 17:
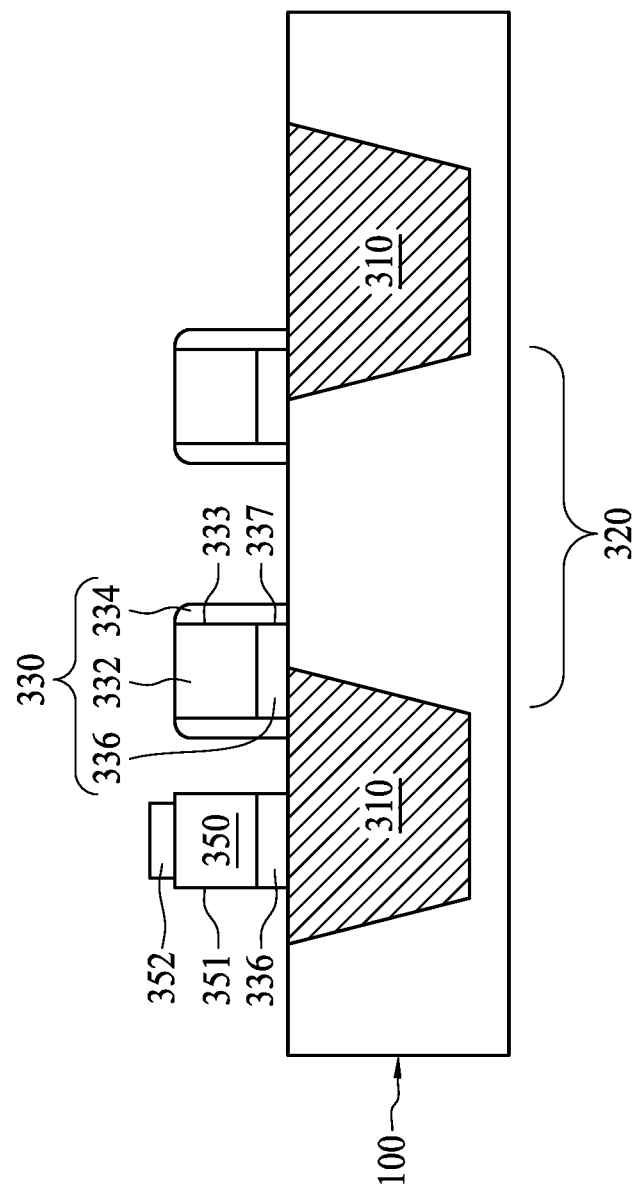
FIG. 17 is a cross-sectional view taken along the line C-C illustrated in FIG. 16.

Referring to FIGS. 16 and 17, in some embodiments, the first metal elements 352 and the second metal elements 360 are formed according to a step 424 in FIG. 4. In some embodiments, a material of the first metal elements 352 disposed on the extending portions 350 of the gate electrodes 332 and the second metal elements 360 disposed on the active region 320 is consistent. In some embodiments, the first metal elements 352 and the second metal elements 360 include copper.

Figure 18:
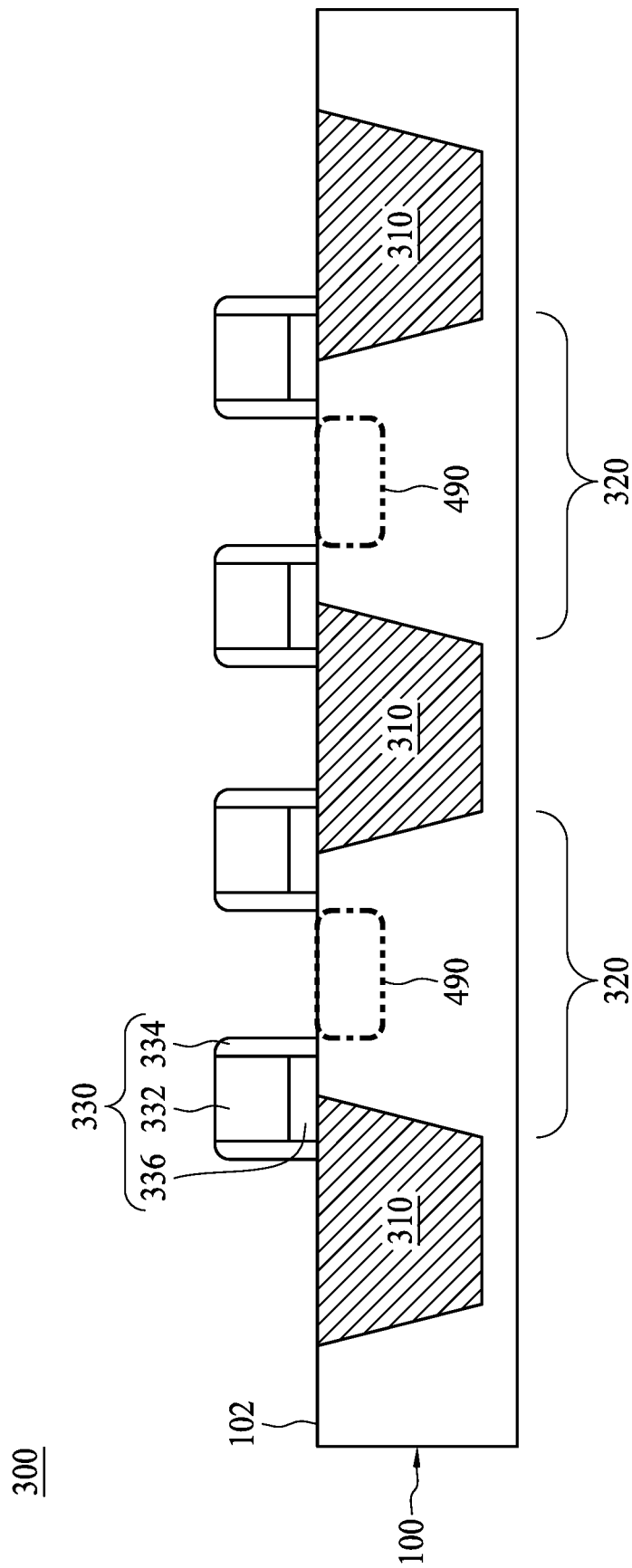
FIG. 18 illustrates a cross-sectional view of an intermediate stage in the formation of the test structure in accordance with some embodiments of the present disclosure.

Referring to FIG. 18, in some embodiments, a doping region 490 is formed in the active region 320 according to a step 426 in FIG. 4. Accordingly, the test structure 300 is completely formed. In some embodiments, an implantation is performed to form the doping region 490. In some embodiments, the amount of implant buried in the active region 320 affects the resistance of the active region 320.

Figure 19:
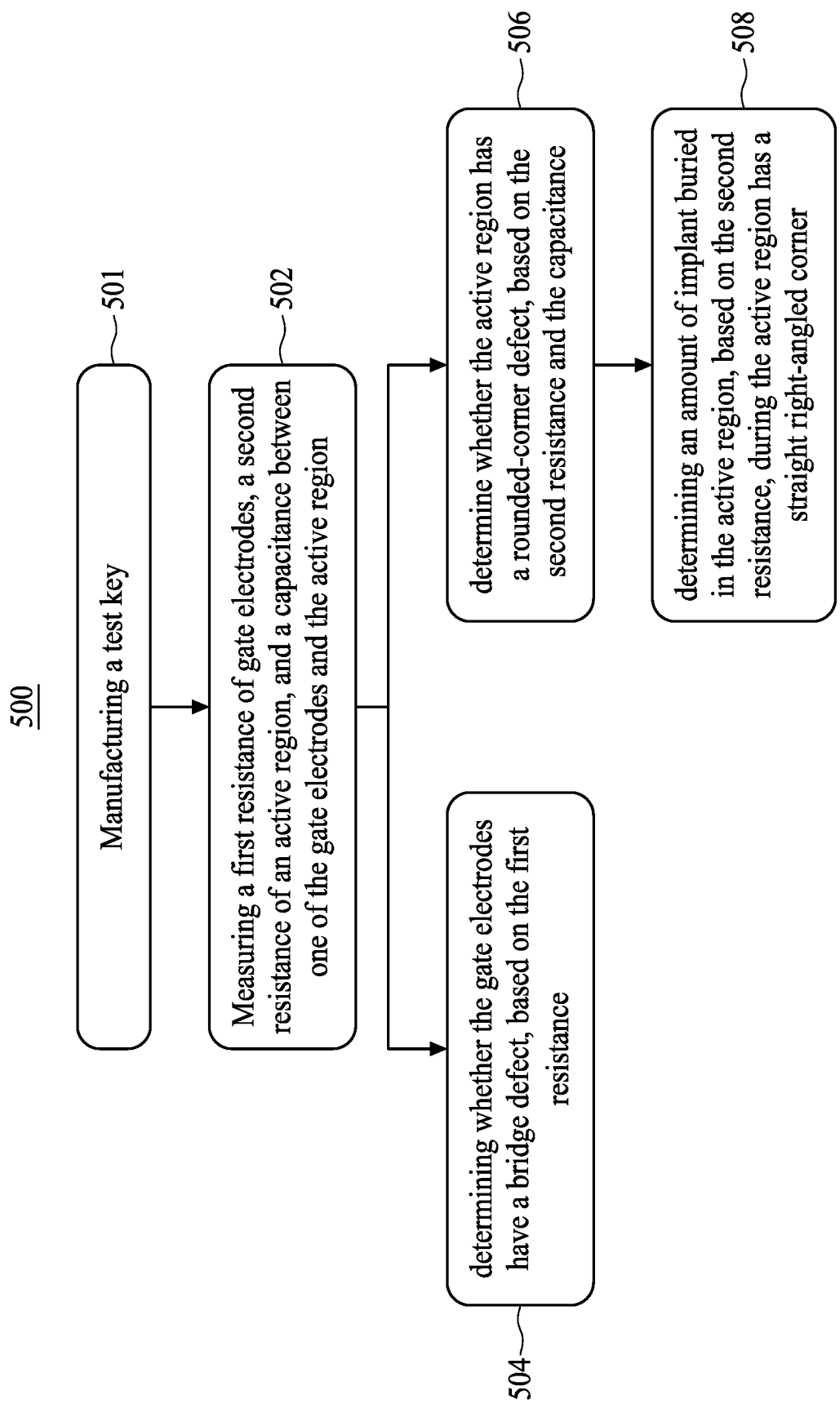
FIG. 19 is a flow diagram illustrating a method for obtaining fabricating information in semiconductor components, in accordance with some embodiments of the present disclosure.

FIG. 19 is a flow diagram illustrating a method 500 for obtaining fabricating information in semiconductor components, in accordance with some embodiments of the present disclosure. Referring to FIG. 18, in a step 501, a test structure is manufactured. In some embodiments, the test structure is manufactured by the method 400 shown in FIG. 4. In a step 502, a first resistance of gate electrodes, a second resistance of an active region, and a capacitance between one of the gate electrodes and the active region are measured. In a step 504, it is determined, based on the first resistance, whether the gate electrodes have a bridge defect. In a step 506, it is determined, based on the second resistance and the capacitance, whether the active region has a rounded-corner defect. In a step 508, an amount of implant buried in the active region is determined, based on the second resistance, when the active region has a right-angled corner.

In conclusion, with the configuration of the semiconductor device, an amount of implant buried in the active region, the bridge defect, and the rounded-corner defect can be checked during the wafer acceptance test to determine product quality.

One aspect of the present disclosure provides test structure on a wafer includes a plurality of isolation regions, an active region, a plurality of gate electrodes, a first metal element, and a second metal element. The active region is disposed between the plurality of isolation regions. The gate electrodes are respectively disposed over one of the isolation regions and the active region. The first metal element is electrically coupled to one of the gate electrodes. The second metal element is electrically coupled to the active region One aspect of the present disclosure provides a semiconductor device. The semiconductor device includes a wafer and a test structure. The wafer has a plurality of component areas and at least one scribe line separating the component areas. The test structure is disposed in the scribe line. The test structure includes a plurality of isolation regions, a plurality of gate electrodes, and a plurality of gate dielectrics. The isolation regions are disposed in the wafer to define an active region in a serpentine-shaped configuration. The gate electrodes are disposed at boundaries where the active region is adjacent to the isolation regions. The gate dielectrics are disposed on sidewalls of the gate electrodes.

One aspect of the present disclosure provides a method for obtaining fabricating information in a semiconductor device. The method includes steps of forming a plurality of isolation regions in a scribe line of a wafer to define an active region in a serpentine-shaped configuration; forming a plurality of gate electrodes and gate dielectrics on the wafer, wherein each of the gate electrodes overlaps a portion of the active region, and the gate dielectrics are disposed between the gate electrodes and the wafer; measuring a first resistance of the gate electrodes; and determining, based on the first resistance, whether the gate electrodes have a bridge defect.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A test structure on a wafer, comprising:
   a plurality of isolation regions;
   an active region disposed between the plurality of isolation regions and continuously extending in a serpentine-shaped configuration, wherein the active region includes two ends;
   a plurality of gate electrodes disposed at and along boundaries where the active region is interfaced with one of the plurality of isolation regions, so that the plurality of gate electrodes are in a serpentine-shaped configuration, wherein each of the plurality of gate electrodes is coupled with the active region and one of the plurality of isolation regions;
   a first metal element electrically coupled to one of the gate electrodes; and
   a plurality of second metal elements respectively disposed at the two ends of the active region, and the at least two second metal elements electrically coupled to the active region.

2. The test structure on a wafer of claim 1, further comprising a plurality of gate spacers disposed on sidewalls of the gate electrodes.

3. The test structure on a wafer of claim 1, further comprising a doping region disposed in the active region.

4. The test structure on a wafer of claim 1, wherein the first metal element is disposed on extending portions of the gate electrodes.

5. The test structure on a wafer of claim 4, further comprising a plurality of gate dielectrics respectively disposed between each one of the gate electrodes and the wafer.

6. The test structure on a wafer of claim 1, wherein the plurality of second metal elements are disposed on the active region where the gate electrodes are not disposed.

7. A semiconductor device, comprising:
- a wafer having a plurality of component areas and at least one scribe line separating the component areas; and
- a test structure in the scribe line, the test structure comprising:
  - a plurality of isolation regions disposed in the wafer to define an active region continuously extending in a serpentine-shaped configuration;
  - a plurality of gate electrodes disposed at and along boundaries where the active region is interfaced with one of the plurality of isolation regions, so that the plurality of gate electrodes are in a serpentine-shaped configuration, wherein each of the plurality of gate electrodes is coupled with the active region and one of the plurality of isolation regions; and
  - a plurality of gate dielectrics disposed between the gate electrodes and the wafer.

8. The semiconductor device of claim 7, wherein the test structure further comprises a plurality of gate spacers disposed on sidewalls of the gate electrodes.

9. The semiconductor device of claim 8, further comprising a doping region disposed in the active region.

10. The semiconductor device of claim 7, further comprising at least one semiconductor component disposed in one of the plurality of component areas, wherein the test structure has at least one physical characteristic related to a structure of the semiconductor component.

11. The semiconductor device of claim 7, wherein the test structure further comprises:
- a plurality of first metal elements electrically coupled to the gate electrodes; and
- a plurality of second metal elements electrically coupled to the active region.

12. The semiconductor device of claim 11, wherein the first metal elements are disposed on extending portions of the gate electrodes.

13. The semiconductor device of claim 12, wherein the extending portions are disposed over the isolation regions.

14. The semiconductor device of claim 12, wherein the extending portions are disposed at both ends of the test structure as viewed from above.

15. The semiconductor device of claim 11, wherein the second metal elements are disposed at both ends of the active region where the gate electrodes are not disposed.

* * * * *